United States Patent
Pukala

[11] Patent Number: 5,946,586
[45] Date of Patent: Aug. 31, 1999

[54] METHOD OF MANUFACTURING A GLASS-COVERED SEMICONDUCTOR DEVICE

[75] Inventor: Andrzej P. Pukala, Stadskanaal, Netherlands

[73] Assignee: U.S. Philips Corporation, New York, N.Y.

[21] Appl. No.: 08/995,475

[22] Filed: Dec. 22, 1997

[30] Foreign Application Priority Data

Dec. 24, 1996 [EP] European Pat. Off. .............. 96203713

[51] Int. Cl.$^6$ .................................................. H01L 29/00
[52] U.S. Cl. .......................... 438/492; 438/505; 438/508; 257/794
[58] Field of Search .................................... 438/503, 505, 438/507, 508, 509, 558, 563, 492; 257/603, 607, 788, 794, 917

[56] References Cited

U.S. PATENT DOCUMENTS 5,760,482  6/1998  Van Aken ............................... 257/794

FOREIGN PATENT DOCUMENTS

2470443A1  5/1981  France .
57-104270  6/1982  Japan .

*Primary Examiner*—Chandra Chaudhari
*Assistant Examiner*—Keith A. Christianson
*Attorney, Agent, or Firm*—Steven R. Biren

[57] ABSTRACT

A method of manufacturing a semiconductor device, in which a pn-junction (2) is provided in a semiconductor wafer (1) of a first conduction type by providing doping atoms of a second conduction type, which is opposed to the first conduction type, via a first main face (3) of the main faces (3, 5) of the wafer (1), subdividing said wafer (1) into individual semiconductor bodies (10) having a pn-junction (2) between and substantially parallel to two opposing connection faces (3, 5), connecting said connection faces (3, 5) to connection bodies (11, 12) by means of a connection layer (15) and covering the semiconductor bodies (10) with a glass (20) A glass-covered semiconductor device is also described. After the pn-junction (2) has been provided on the first main face (3) of the semiconductor wafer (1), a monocrystalline silicon layer (7) having atoms of the second conduction type is epitaxially provided, whereafter the wafer (1) is subdivided into semiconductor bodies (10). By virtue thereof, the percentage of rejects during the manufacturing process is substantially reduced.

7 Claims, 2 Drawing Sheets

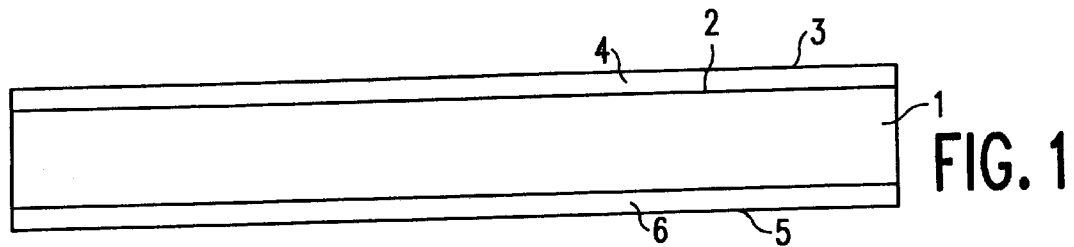
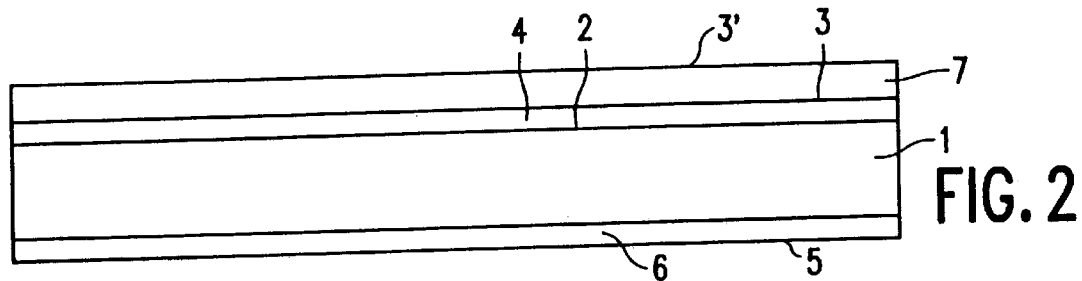
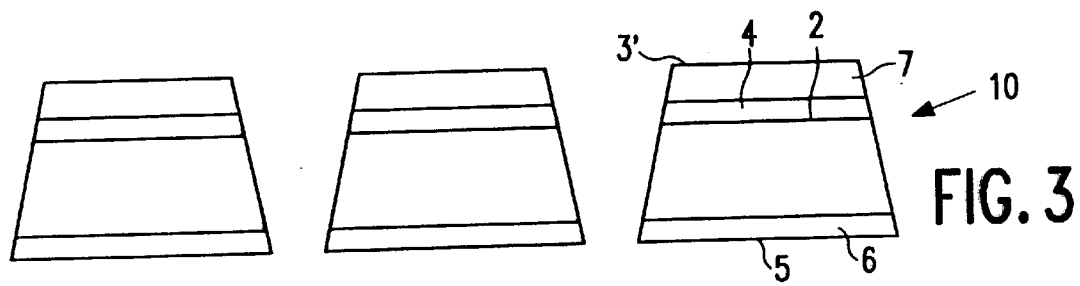
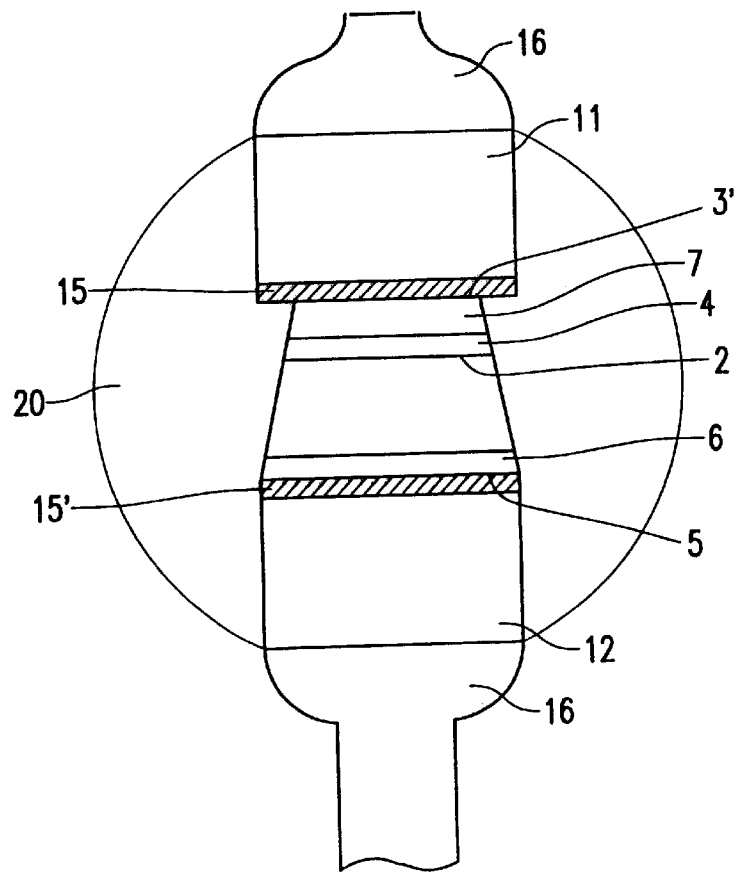

METHOD OF MANUFACTURING A GLASS-COVERED SEMICONDUCTOR DEVICE

BACKGROUND OF THE INVENTION

The invention relates to a method of manufacturing a semiconductor device, in which a pn-junction is provided in a semiconductor wafer of a first conduction type by providing doping atoms of a second conduction type, which is opposed to the first conduction type, via a first main face of the wafer, subdividing said wafer into individual semiconductor bodies having a pn-junction between and substantially parallel to two opposing connection faces, connecting said connection faces to connection bodies by means of a connection layer and covering the semiconductor bodies with a glass. The invention also relates to a glass-covered semiconductor device.

Such a method is used to manufacture devices which are also referred to as glass-drop diodes or implotec diodes. Such diodes can very suitably be used for applications in which very good passivation, hermetic sealing of the semiconductor body, sturdiness or resistance to high temperatures is important. The semiconductor device manufactured by means of said method comprises a semiconductor body with a pn-junction which extends completely parallel to one of the connection faces of the semiconductor body. Each of the connection faces is connected to one side of the pn-junction. The connection faces, and hence both sides of the pn-junction, are connected to connection bodies serving to enable the semiconductor device to be electrically connected, for example, to a printed circuit board. The glass passivates the semiconductor body and the pn-junction and forms a barrier against moisture.

The English-language summary of Japanese patent application JP 57-104270 discloses a method of the type mentioned in the opening paragraph.

A disadvantage of the above-described method in accordance with the prior art is that it leads to a relatively high percentage of rejects in the manufacture of the semiconductor device.

SUMMARY OF THE INVENTION

One of the objects of the invention is to obviate said disadvantage.

To achieve this, the method in accordance with the invention is characterized in that after the provision of the pn-junction on the first main face of the semiconductor wafer, a monocrystalline layer of silicon having atoms of the second conduction type is epitaxially provided, whereafter the wafer is subdivided into semiconductor bodies.

This results in a much smaller percentage of rejects during the manufacturing process.

It is assumed that in the known method of manufacture, rejects occur because atoms diffuse from the connection layer, which in practice is a metal-containing layer, to the pn-junction where they cause a short-circuit. During the provision of the connection layer and during the provision of the glass, the semiconductor body and the connection bodies are at a relatively high temperature so that atoms can diffuse relatively readily from the connection layer. As a result of the measure in accordance with the invention, the pn-junction is much farther removed from the connection faces of the semiconductor body because the epitaxially grown silicon layer is situated between the connection faces and the pn-junction. An epitaxially grown layer of silicon reduces the rate of diffusion of atoms from the connection layer in such a manner that the properties of the pn-junction are not subject to change. A second reason for rejects during the manufacturing process could be that during cleaning prior to the provision of the glass, the connection layer is attacked and deposits at the location where the pn-junction surfaces, thereby short-circuiting the pn-junction. By virtue of the presence of the layer of silicon, the pn-junction is farther removed from the connection layer, so that this problem is substantially reduced.

Preferably, after the provision of the epitaxial layer, a thermal treatment is carried out to bring about a further out-diffusion of atoms of the second doping type. Thermal treatments at different temperatures and of different durations enable the concentration profile of the doping atoms to be adapted. By virtue thereof, for example, zener diodes having different zener voltages can be manufactured. For example, it is possible to manufacture zener diodes having a very low zener voltage <7.5 V, which diodes cannot be manufactured conventionally because conventional processes require a relatively long diffusion time at a high temperature to obtain the necessary distance between the pn-junction and a surface. The steepness of the concentration profile is adversely affected by this long diffusion time.

Preferably, the monocrystalline silicon layer which is provided comprises a quantity of doping atoms which exceeds $1 \times 10^{19}$ cm$^{-3}$. As a result, the series resistance between the pn-junction and connection bodies is influenced only slightly by the application of the layer. An additional advantage is achieved if, in the method in accordance with the invention, the doping atoms of the first conduction type are p-type doping atoms and the atoms of the second conduction type are n-type doping atoms, while the connection layer comprises aluminium atoms. An aluminium-containing connection layer can very suitably be used for connecting the connection bodies. In the known method, aluminium atoms diffuse from the connection face to the pn-junction. As aluminium is a p-type doping atom, in the known method, the n-side of the pn-junction is over-doped. In the method in accordance with the invention, the pn-junction is situated at such a distance from the connection face that problems regarding over-doping do not arise, while, in addition, the epitaxial silicon layer is so highly doped that over-doping by aluminium atoms does not lead to problems.

Preferably, the monocrystalline silicon layer is applied in a thickness above 10 $\mu$m. Although also a thinner layer already leads to a reduction of the percentage of rejects in the manufacturing process, in practice, particularly a thickness of the epitaxial silicon layer above 10 $\mu$m causes a substantial reduction of the percentage of rejects.

An additional advantage is achieved if connecting the connection faces or covering the semiconductor bodies with the glass takes place at a temperature above 500° C. As a result, the semiconductor device manufactured by means of said method can very suitably be used for applications at a relatively high temperature. Semiconductor devices manufactured at such temperatures by means of the known method, exhibit a relatively high percentage of rejects.

The invention also relates to a semiconductor device of the sealed-in-glass type comprising a monocrystalline semiconductor body having two facing connection faces and a pn-junction which extends parallel to one of the connection faces, said connection faces being connected to connection bodies. In accordance with the invention, the semiconductor device is characterized in that the semiconductor body is provided with an epitaxial silicon layer situated between the pn-junction and a connection body. Thus, the semiconductor body is provided with a pn-junction. The pn-junction itself does not form part of the epitaxial silicon layer. Such a semiconductor device has the advantage that a very low percentage of rejects occurs in the manufacture of the semiconductor device.

These and other aspects of the invention will be apparent from and elucidated with reference to the embodiments described hereinafter.

BRIEF DESCRIPTION OF THE DRAWING

In the drawings:

FIGS. 1 through 3 show different stages in the manufacture of a semiconductor device in accordance with the invention, FIG. 4 shows a semiconductor device manufactured in accordance with the inventive method.

Figure 5:
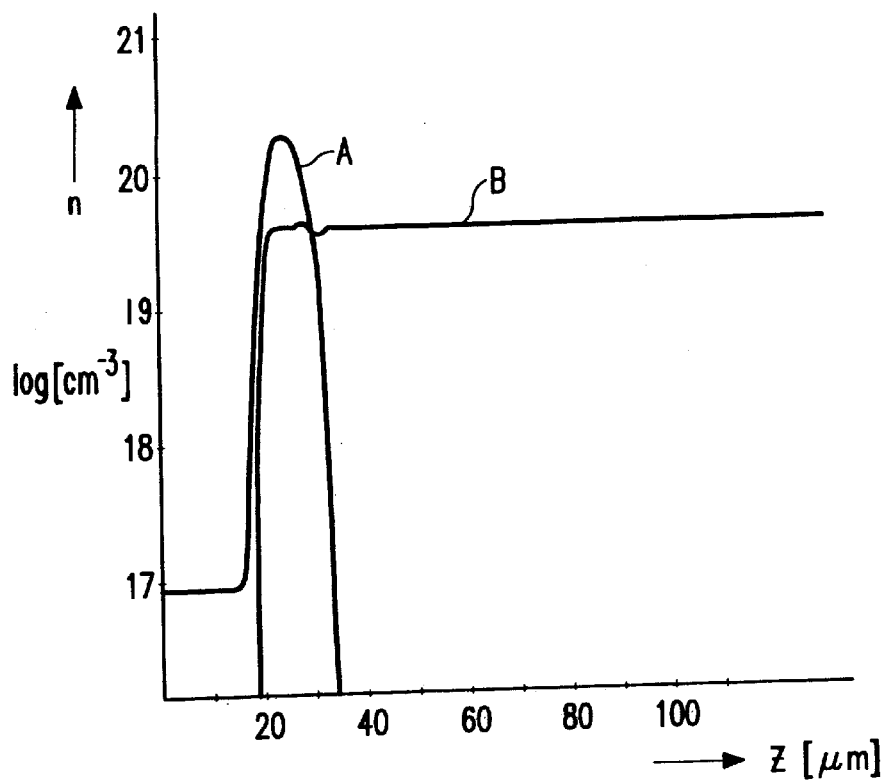
FIG. 5 shows a graph of the logarithm of the concentration of doping atoms n as a function of the depth z below the surface 3' immediately after the application of the epitaxial layer.

The Figures are purely schematic and not drawn to scale.

DESCRIPTION OF THE PREFERRED EMBODIMENTS

FIG. 1 shows a first step in the manufacture of a glass-drop diode semiconductor device by means of the method in accordance with the invention. A semiconductor wafer 1 of a first conduction type, in this example an approximately 200 μm thick wafer with a B-doping of $10^{19}$ cm$^{-3}$, is provided in a customary manner with a pn-junction 2 by providing doping atoms, in this example P atoms, of a second conduction type which is opposed to the first conduction type, via one of the main faces 3 of the wafer 1. This results in the formation of an approximately 15 μm thick region 4 which is adjacent to the main face 3 and which has a doping of $10^{20}$ cm$^3$. In order to enable proper electric contact with the connection bodies to be achieved, in this example, the other main face 5 of the wafer is provided with a region 6 with B-atoms having a doping of approximately $10^{20}$ cm$^{-3}$. In this example, the regions 4 and 6 are provided in a customary manner by the application of a doped glass layer and diffusion at an elevated temperature.

FIG. 2 shows how, in accordance with the invention, the first main face 3 of the semiconductor wafer 1 is provided with an epitaxial silicon layer 7 comprising atoms of the second conduction type after the pn-junction 2 has been provided. The monocrystalline silicon layer 7 is preferably provided in a thickness above 10 μm, in this example 50 μm. In this example, the monocrystalline silicon layer provided comprises a quantity of $1\times10^{20}$ cm$^{-3}$ of P-doping atoms. The layer 7 is applied by means of a standard epitaxial process in which a monocrystalline silicon layer is applied from SiHCl$_3$ at a temperature of 1150° C. After the epitaxial layer 7 has been applied, the semiconductor wafer 1 is subdivided into individual semiconductor bodies 10 by means of a standard process, such as the provision of a mask and sand blasting. FIG. 3 shows the resultant semiconductor bodies 10. Said semiconductor bodies 10 comprise a pn-junction 2 between and parallel to two opposing faces 3', 5. The assembly of the semiconductor bodies 10 is completed by connecting the faces 3', 5 of the semiconductor bodies 10 to connection bodies 11, 12, respectively. For this purpose, a connection layer 15 comprising silver and aluminium is vapor-deposited by means of an E-gun onto the connection face 3' by, successively, applying a 0.2 μm thick molybdenum layer and a 6 μm thick aluminium layer. After heating the molybdenum and aluminium layers, they form a molybdenum-aluminium bonding layer 15. A 7.5 μm thick aluminium layer is applied to the connection face 5 by means of an E-gun. After alloying said layer, a bonding layer 15' is obtained. In practice, the connection bodies comprise molybdenum connecting plugs 11, 12 and copper wires 16. After forming the connection, the connected structure is cleaned by means of a so-called lye-etching process in an alkaline solution of Na(OH) (40 g/l) to enable a good adhesion of the glass 20 to the structure. After the cleaning process, the resultant structure is provided with a glass suspension, for example, of lead-borate glass or zinc-borate glass, which is also referred to as Schott glass or Ferro glass. The glass suspension is sintered at a temperature, in this example in the range between 700 and 730 ° C., which is lower than the temperature used during connecting the connection bodies to the semiconductor body. The glass 20 covers both the semiconductor body 10 and at least a part of the connecting plugs 11, 12. As connecting the connection faces 3', 5 and covering the semiconductor bodies 10 with the glass 20 takes place at a temperature above 500° C., semiconductor devices are obtained which can very suitably be used at relatively high temperatures.

In practice, it has been found that the method in accordance with the invention enables the percentage of rejects in the manufacturing process to be substantially reduced as compared to the known method.

The invention also relates to a semiconductor device of the sealed-in-glass type comprising a monocrystalline semiconductor body 10 having two opposite connection faces 3', 5 and a pn-junction 2 which extends parallel to one of the connection faces 3', 5, said connection faces 3', 5 being connected to the connection bodies 11, 12, 16. In accordance with the invention, the semiconductor device is characterized in that the semiconductor body 10 is provided with an epitaxial silicon layer 7 which is situated between the pn-junction 2 and a connection body 11. Consequently, a pn-junction 2 is provided in the semiconductor body 10. Said pn-junction 2 itself does not form part of the epitaxial silicon layer 7. Such a semiconductor device has the advantage that a very low percentage of rejects occurs in the manufacture of the semiconductor device.

Figure 6:
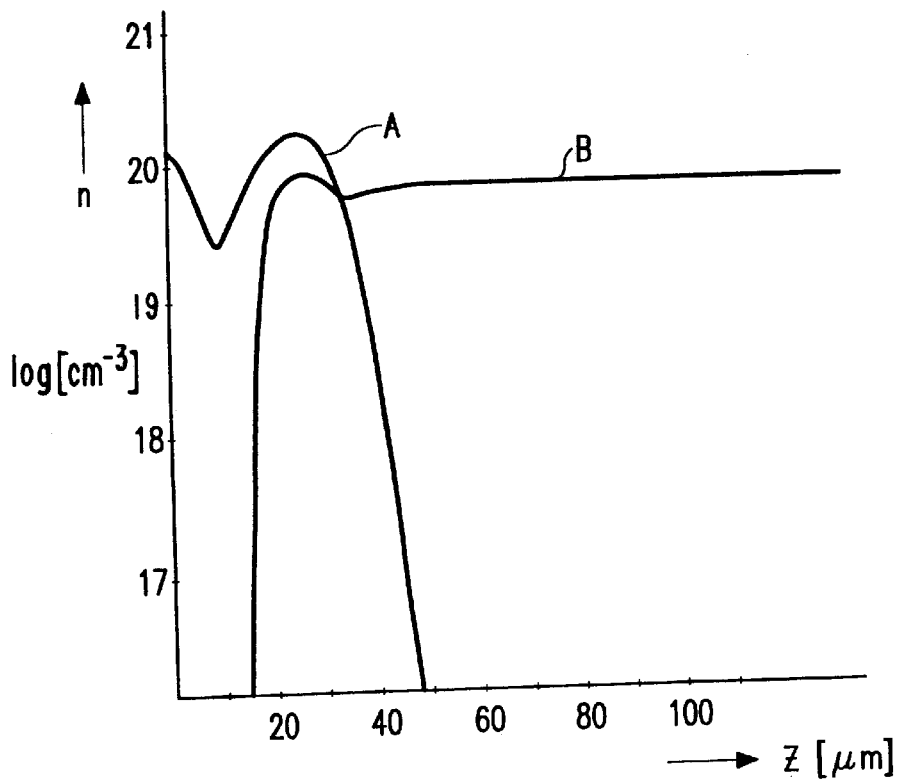
FIG. 6 shows a graph of the logarithm of the concentration of doping atoms n as a function of the depth z below the surface 3' after a thermal treatment at 1200° C. for 600 minutes.

It is alternatively possible to manufacture a so-called implotec diode. The method is practically the same as the method used to manufacture a glass-drop diode. However, in an implotec diode use is made of an approximately 20 μm thick epitaxial layer having a P-doping concentration of $1\times10^{17}$ cm$^{-3}$. FIG. 5 shows a concentration profile of doping atoms in the silicon wafer 1, measured from the surface 3' immediately after the application of the epitaxial layer. If a diode is made from such a wafer, then this diode has a zener voltage of 7 V. The concentration profile can be influenced by subjecting the wafer 1 to an aftertreatment. FIG. 6 shows the concentration profile after a thermal treatment for 600 minutes at 1200° C. Such a thermal treatment yields a zener diode having a zener voltage of 8 V. A treatment for 3000 minutes at 1200° C. yields a diode having a zener voltage of 12 V. The wafer 1 is subsequently subdivided into individual semiconductor bodies (see FIG. 3). The connection faces 3', 5 are provided, by means of a vapor-deposition process using an E-gun, with a 0.1 μm thick titanium layer, a 0.3 μm thick silver layer and a 5 μm thick aluminium layer 15, 15'. The assembly of the implotec diodes is completed by placing the connection bodies 11, 12, 16 and the semiconductor bodies 10 in a glass tube, for example, of lead-borate glass or zinc-borate glass, also referred to as Schott glass or Ferro glass, and heating this at a reduced pressure. During softening and melting of the glass tube, said glass tube implodes, causing the semiconductor body 10 and the connection bodies 11, 12 to be pressed together, and, at the same time, a proper protection (passivation) of the semiconductor body 10 is obtained. By virtue of the use of the epitaxial layer 7, problems regarding diffusion of aluminium atoms from the bonding layer 15 to the pn-junction 2 are precluded in these implotec diodes. As a result, the percentage of rejected implotec diodes manufactured by means of a method in accordance with the invention is lower than that of diodes made by means of a conventional method.

The invention is not limited to the above-described examples. In the foregoing, specific techniques for manufacturing the semiconductor device are mentioned. However, this does not mean that the method in accordance with the invention can only be carried out by means of said techniques. For example, in the example, the pn-junction is provided by diffusion of doping atoms from a glass layer into a silicon wafer. It will be obvious that it is alternatively possible to use other methods of making said pn-junction, such as implantation, activation and diffusion. Besides, subdivision of the semiconductor wafer 1 into individual semiconductor devices can also be achieved by means other than sand blasting, for example by scribing and breaking.

What is claimed is:

1. A method of manufacturing a semiconductor device, comprising:

forming a pn-junction in a semiconductor wafer of a first conduction type by providing doping atoms of a second conduction type, opposite to the first conduction type, via a first main face of the wafer; then epitaxially forming a monocrystalline layer of silicon having atoms of the second conduction type on said first main face of the wafer; then subdividing the wafer into individual semiconductor bodies each having a portion of the pn-junction between and substantially parallel to two opposing connection faces;

connecting the connection faces to connection bodies by a layer; and covering the semiconductor bodies with a glass.

2. A method as claimed in claim 1, further comprising, after forming the monocrystalline layer, performing a thermal treatment to bring about a further out-diffusion of atoms of the second doping type.

3. A method as claimed in claim 1, further comprising providing the monocrystalline silicon layer with a quantity of doping atoms which exceeds $1\times10^{19}$ cm$^{-3}$.

4. A method as claimed in claim 1, further comprising providing the doping atoms of the first conduction type as p-type doping atoms and the atoms of the second conduction type as n-type doping atoms, and providing the connection layer with aluminium atoms.

5. A method as claimed in claim 1, further comprising providing the monocrystalline silicon layer to a thickness above 10 μm.

6. A method as claimed in claim 1, wherein connecting the connection faces or covering the semiconductor bodies with the glass is performed at a temperature above 500° C.

7. A semiconductor device of the sealed-in-glass type comprising a monocrystalline semiconductor body having two facing connection faces and a pn-junction which extends parallel to one of the connection faces, said connection faces being connected to connection bodies, wherein the semiconductor body is provided with an epitaxial silicon layer situated between the pn-junction and a connection body and having a same conduction type as that of an adjoining portion of said semiconductor body.

* * * * *